US009429858B2

(12) United States Patent
Chien et al.

(10) Patent No.: US 9,429,858 B2
(45) Date of Patent: Aug. 30, 2016

(54) ROTARY EUV COLLECTOR

(71) Applicant: Taiwan Semiconductor Manufacturing Co., Ltd., Hsin-Chu (TW)

(72) Inventors: Shang-Chieh Chien, New Taipei (TW);
Shu-Hao Chang, Taipei (TW);
Jui-Ching Wu, Hsinchu (TW);
Tsung-Yu Chen, Hsinchu (TW);
Tzu-Hsiang Chen, Zhubei (TW);
Ming-Chin Chien, Hsinchu (TW);
Chia-Chen Chen, Hsinchu (TW);
Jeng-Horng Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 249 days.

(21) Appl. No.: 14/035,268

(22) Filed: Sep. 24, 2013

(65) Prior Publication Data

US 2015/0085264 A1    Mar. 26, 2015

(51) Int. Cl.
*G03F 7/20* (2006.01)

(52) U.S. Cl.
CPC ......... *G03F 7/70916* (2013.01); *G03F 7/2008* (2013.01); *G03F 7/2037* (2013.01); *G03F 7/70033* (2013.01); *G03F 7/70175* (2013.01); *G03F 7/70925* (2013.01)

(58) Field of Classification Search
CPC ............. G03F 7/2008; G03F 7/70033; G03F 7/70166; G03F 7/70175; G03F 7/70825; G03F 7/70883; G03F 7/70891; G03F 7/70908; G03F 7/70916; G03F 7/70925
USPC ................................ 355/30, 67, 77; 359/872
See application file for complete search history.

(56) References Cited

U.S. PATENT DOCUMENTS

| 6,339,634 | B1* | 1/2002 | Kandaka et al. | 378/119 |
| 6,690,764 | B2* | 2/2004 | Kondo | 378/119 |
| 7,476,886 | B2  | 1/2009 | Bykanov et al. | |
| 7,482,609 | B2  | 1/2009 | Ershov et al. | |
| 2005/0219707 | A1* | 10/2005 | Schuster | G02B 3/12 359/665 |
| 2006/0039052 | A1* | 2/2006 | Sano | G02B 27/0025 359/196.1 |
| 2006/0131515 | A1* | 6/2006 | Partlo et al. | 250/504 R |

(Continued)

FOREIGN PATENT DOCUMENTS

| EP | 2488002 A2 | 8/2012 |
| JP | 2008108822 A * | 5/2008 |
| WO | 2008027158 A2 | 3/2008 |

OTHER PUBLICATIONS

Anonymous (Research Disclosure database No. 593004).*

(Continued)

*Primary Examiner* — Colin Kreutzer
(74) *Attorney, Agent, or Firm* — Eschweiler & Associates, LLC

(57) ABSTRACT

An EUV collector is rotated between or during operations of an EUV photolithography system. Rotating the EUV collector causes contamination to distribute more evenly over the collector's surface. This reduces the rate at which the EUV photolithography system loses image fidelity with increasing contamination and thereby increases the collector lifetime. Rotating the collector during operation of the EUV photolithography system can induce convection and reduce the contamination rate. By rotating the collector at sufficient speed, some contaminating debris can be removed through the action of centrifugal force.

20 Claims, 4 Drawing Sheets

(56) References Cited

U.S. PATENT DOCUMENTS

2008/0104828 A1* 5/2008 Someya et al. ............ 29/720
2009/0272917 A1* 11/2009 Soer et al. ............ 250/492.1
2010/0157267 A1* 6/2010 Schimmel et al. .......... 355/67
2010/0282986 A1* 11/2010 Zink ...................... 250/504 R
2010/0321660 A1* 12/2010 Peng et al. ................ 355/67
2011/0007292 A1* 1/2011 Van Herpen et al. ....... 355/67

OTHER PUBLICATIONS

Anonymous ("Rotating Collector Mirror extreme ultraviolet Radiation Source and a wind shield like wiper to create Hydrogen Radicals" Research Disclosure database No. 555016).*

Fahy et al ("Robust liquid metal collector mirror for EUV and soft X-ray plasma," Proceedings of SPIE : vol. 7802).*

* cited by examiner

ROTARY EUV COLLECTOR

FIELD

The present disclosure relates to photolithography systems and methods, especially systems and methods of lithography that expose a photoresist using extreme ultraviolet (EUV) radiation.

BACKGROUND

Since the invention of the integrated circuit, the semiconductor industry has continuously sought to improve the density of integrated circuit components (transistors, diodes, resistors, capacitors, etc.). For the most part, improvements in density have come from reductions in feature size, allowing more components to be formed within a given area.

An essential tool for integrated circuit manufacturing is photolithography. The minimum feature size that can be resolved by a photolithography system, referred to as the critical dimension (CD), is proportional to the wavelength of light that is used. This has led to the development of lithography systems that use EUV light, which is light having a wavelength in the range from about 1 to about 100 nm. An EUV lithography system requires an EUV light source. A typical EUV light source forms a microplasma by shooting droplets of tin at a target on which the output of a $CO_2$ laser is focused.

The microplasma emits radiation in all directions. It is highly desirable to collect that radiation as efficiently as possible and redirect it towards an illumination system of the photolithography tool. In order to keep the size of the collector's mirror within reasonable limits, the collector has to be mounted relatively close to the microplasma. As a consequence, the mirror tends to becomes contaminated by debris ejected from the plasma region. Contamination results in a loss of reflectivity, which eventually necessitates replacement of the collector. Replacing the collector requires a significant amount of downtime for the photolithography tool.

DETAILED DESCRIPTION

It has been observed that material such as tin that is ejected from a microplasma contaminates an EUV collector asymmetrically. Furthermore, it has been determined that diminution in performance of an EUV photolithography system with increasing contamination of the system's collector does not relate merely to a loss of reflectivity from the collector's mirror, but is also related to a loss of image fidelity that occurs when the collector is asymmetrically contaminated. The present disclosure provides the solution of rotating the collector about an axis of symmetry of its mirror over the course of the collector's operating life. Rotating the collector causes contamination to be more evenly distributed and significantly increases the useful life of the collector. By rotating the collector at sufficient speed, some contaminating debris can be removed through the action of centrifugal force. If gas is present in the chamber housing the collector, rotating the collector during operation of the EUV lithography system can enhance gas convection near the collector and reduce the rate at which contaminants deposit on the collector.

Figure 1:
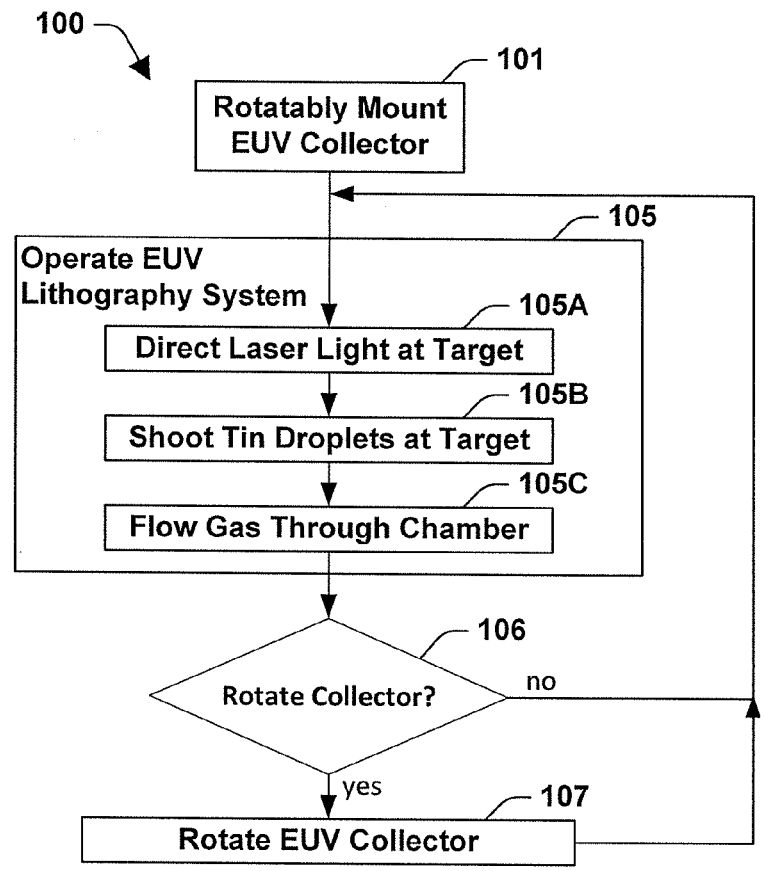
FIG. 1 is a flow chart of a process according to an embodiment of the present disclosure.
Figure 2A:
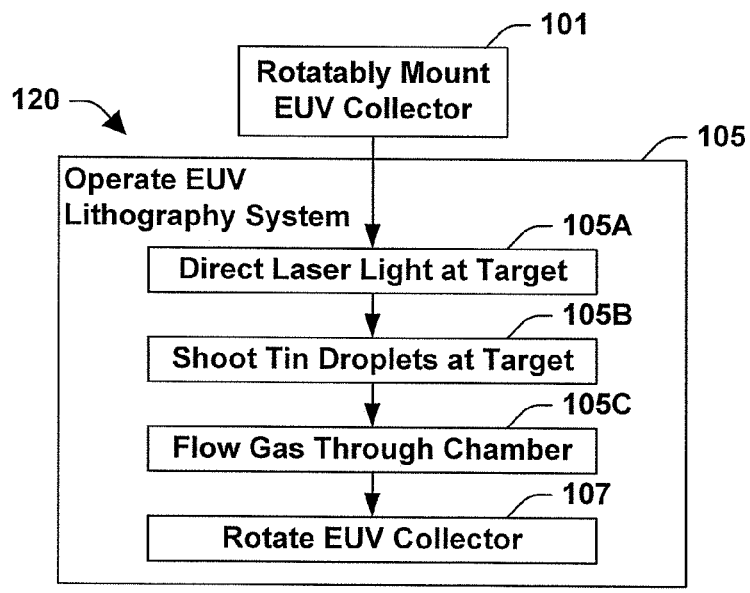
FIG. 2A is a flow chart of a process according to another embodiment of the present disclosure.
Figure 3:
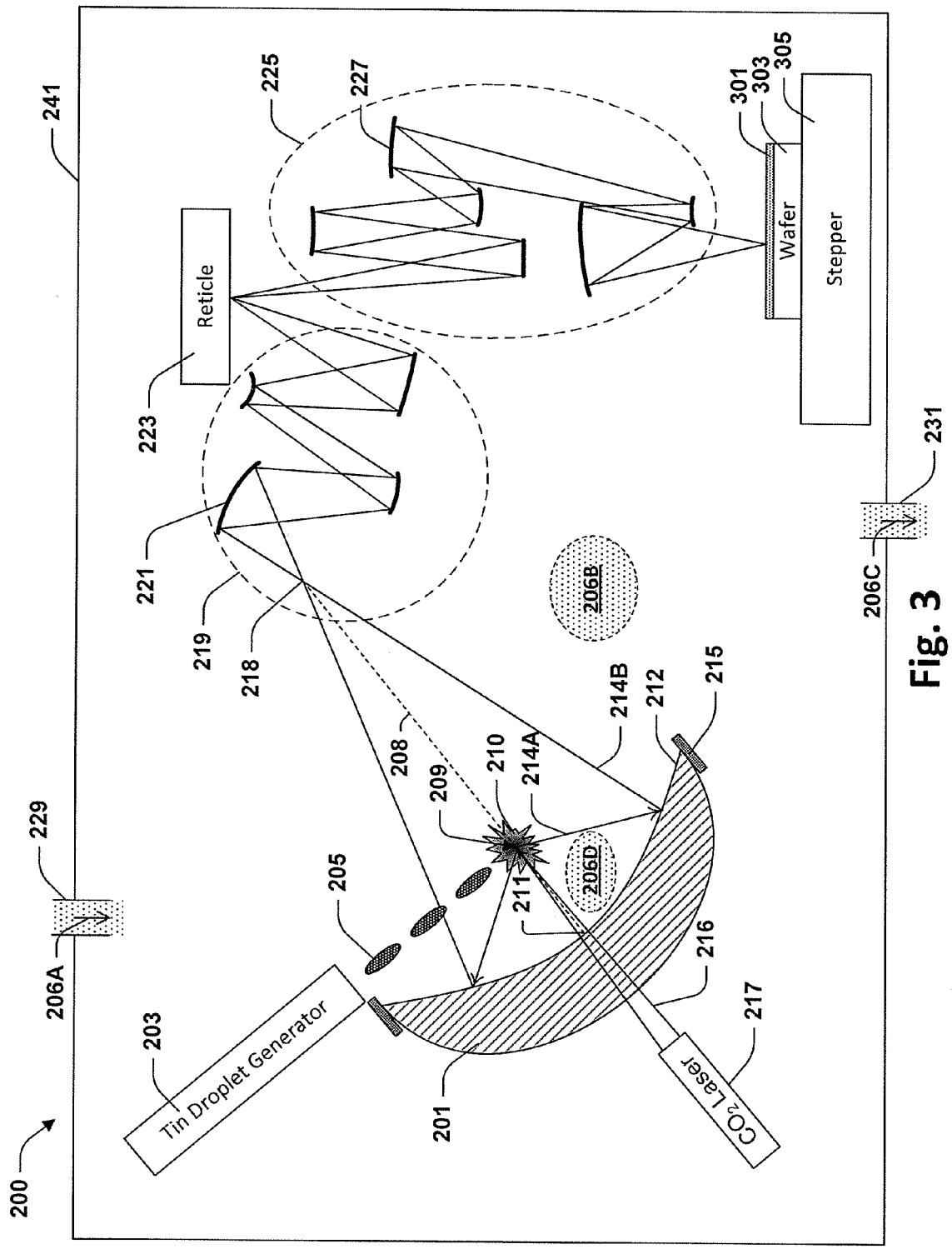
FIG. 3 is an illustration of a photolithography system according to an embodiment of the present disclosure.

FIG. 1 is a flow chart of a process 100 according to an embodiment of the present disclosure in which an EUV collector is rotated between operations of an EUV lithography system. FIG. 2A is a flow chart of a method 200 according to another embodiment of the present disclosure in which an EUV collector is rotated while an EUV lithography system is operating. FIG. 3 illustrates a lithography system 200 with which either process 100 or process 120 can be implemented and which is itself another embodiment of the present disclosure.

The process 100 begins with action 101, which is rotatably mounting a collector 201. Collector 201 is rotatably mounted to a support (not shown) that is part of EUV lithography system 200. A rotatable mounting can be any mounting system that holds collector 201 in position for operation of EUV lithography system 200 and permits collector 201 to be rotated without detaching it from its mounting. If collector 201 can be rotated without employing a rotatable mounting, then action 101 is optional.

Process 100 continues with a series of actions 105 by which the EUV lithography system 200 is operated to expose a resist 301 on a wafer 303. The actions 105 of operating the EUV lithography system 200 include action 105A, focusing light 216 from $CO_2$ laser 217, or other suitable light source, on a target 209 and action 105B, shooting droplets of tin 205, or other suitable material at target 209. These actions form microplasma 208, which generates EUV light 214A. EUV light 214A reflects off a mirror surface 212 of collector 201 to produce reflected EUV light 214B. EUV light 214A is widely scattered. Collector 201 collects EUV light 214A by reflecting it and focusing it on a reflector 221 within an illumination system 219. Illumination system 219 further reflects the collected EUV light 214B off reticle 223, which forms an image from EUV light 214B. The image is reflected from optics 227 within projection system 225, which shines EUV light 214B onto photoresist 301, which is coated on the surface of a wafer 303 mounted on stepper 305. The lithography system 200 thereby selectively exposes photoresist 301 in a pattern defined by the retlicle 223.

In some embodiments action 105, operating EUV lithography system 200, further includes action 105C, flowing a gas 206 through a chamber 241 in which collector 201 and other components of EUV lithography system 200 are enclosed. With reference to FIG. 3, gas 206A is gas 206 as it enters the chamber 241 through inlet port 229. Gas 206B is gas 206 while it resides within the chamber 241. Gas 206D is a portion of gas 206B that is located in proximity to the mirror surface 212 of the collector 201. gas 206C is gas 206 as it leaves the chamber 241 through outlet port 231.

Following action 105, operating EUV lithography system 200, process 100 continues with action 106, determining whether to rotate EUV collector 201. In some embodiments, rotating EUV collector 201 requires opening chamber 241 and collector 201 is rotated while EUV lithography system 200 is offline. Accordingly, in some embodiments, action 106 is, or includes, determining whether the EUV lithography system 200 is offline and in some embodiments, action 106 includes determining whether the EUV lithography system 200 can be taken offline.

In some embodiments, EUV collector 201 can be rotated while the EUV lithography system 200 is online and chamber 241 is closed. In some of these embodiments, EUV collector 201 is not rotated while EUV lithography system 200 is operating in the sense of producing EUV light 214A and etching wafer 303. In these embodiments, action 106 includes determining whether EUV lithography system 200 is between operations. These embodiments can be advantageous if the focus of collector 201 is adversely affected during rotation of EUV collector 201.

In some embodiments, the collector 201 is rotated periodically with respect to operation of the EUV lithography system 200 and action 106 includes determining whether the a time to rotate collector 201 has arrived. A periodic rotation can be periodic with respect to any parameter that advances monotonically as the EUV lithography system 200 operates. Examples of parameters against which a period between rotations can be set include, without limitation, number of pulses from a laser 217, time of operation, number of exposures, number of wafers processed, and amount of plasma generated. The amount of each rotation can also be set in any suitable manner. In some embodiments, the rotation is through a fixed angle for each period, such as 5 degrees, 15 degrees, 45 degrees, 90 degrees, or 180 degrees. The amount of rotation at each interval can be variable. In some embodiments, the amount of rotation is randomly set for each interval.

In some embodiments, the collector 201 is spun. In some embodiments, the collector 201 is spun sufficiently rapidly to cause a significant amount of contamination to release from the collector under the action of centrifugal force. Removal by spinning is facilitated by having the collector 201 heated to a temperature above the melting point of a contaminant, such as tin. For example, a temperature of 250° C. is desirable for removing tin. In some embodiments, contaminants are removed by spinning while the lithography system 200 is in operation. In an alternate embodiment, contaminants are removed by spinning the heated collector 201 while the lithography system 200 is offline.

In some embodiments, collector 201 can be rotated while EUV lithography system 200 is online and in use. In some of these embodiments, the collector 201 is rotated periodically as previously described, but in some others of these embodiments collector 201 is rotated continuously while EUV lithography system 200 is online and operating. FIG. 2A is a flow chart of a process 120 according to another embodiment of the present disclosure and is a process in which, action 107, rotating EUV collector 201, takes place during the action 105 of operating EUV lithography system 200. One advantage of rotating the EUV collector 201 while the EUV lithography system 200 is being operated is that contamination can be made more uniform. In some embodiments, there is gas 206 within the chamber 241 in which microplasma 210 is formed and collector 201 is located. In these embodiments, rotating the EUV collector 201 continuously can induce convection of the gas 206D in proximity to the collector 201. While any effective rotation speed can be used, in some embodiments the rotation speed is in the range from 10 to 10,000 rpm. Convection improves dispersal of contaminants and can reduce the rate at which contaminants deposit on the collector 201.

EUV radiation 214 is absorbed strongly by essentially every material. It is usual to operate an EUV lithography system 200 in vacuum. It has been found, however, that a density of gas 206 that does not excessively absorb EUV light within the chamber 241 can produce sufficient convection within the chamber 241 to significantly mitigate contamination of the collector 201.

According to an embodiment of the present disclosure, an EUV lithography system 200 operates with a pressure in the range from 0.1 to 4.0 torr. In some of these embodiments, the pressure is in the range from 0.5 to 2.0 torr. The best results for a hydrogen atmosphere appear to be obtained when the gas is at a pressure of about 0.9 torr. While hydrogen has been tested, other gases can be used in addition to or instead of hydrogen. Other gases that can be used include, for example, nitrogen. In embodiments that maintain gas 206 within chamber 241, the effect of gas 206 in mitigating contamination of the EUV collector 201 can be enhanced by continuously rotating EUV collector 201 during operation of the EUV lithography system 200. Process 120 of FIG. 2A illustrates these embodiments.

Figure 2B:
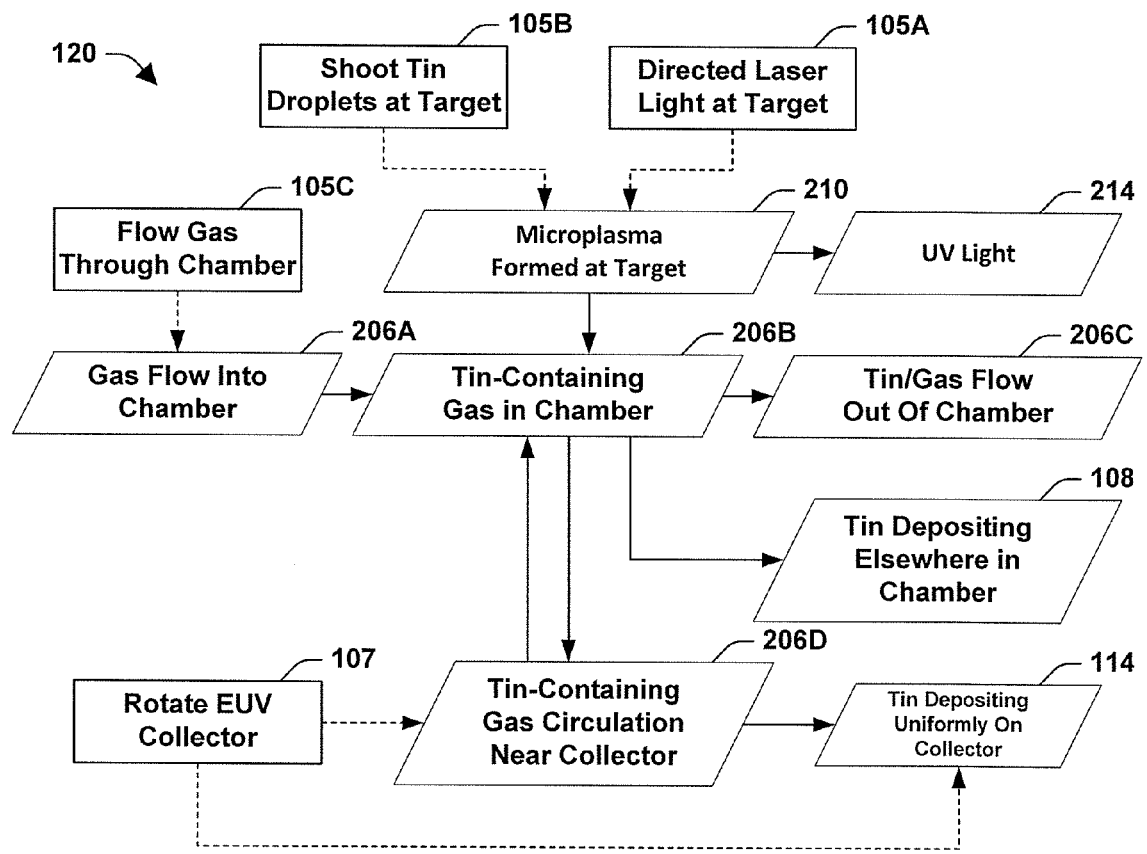
FIG. 2B is a diagram showing how the actions of the process of FIG. 2A interact to affect a system in another embodiment of the present disclosure.

The process 120 includes the actions 105 by which the EUV lithography system 200 is operated and action 107, rotating the EUV collector 201. In process 120, these actions are carried out simultaneously. FIG. 2B is provided to illustrate how these simultaneous actions can interact and affect the EUV lithography system 200. In FIG. 2B, actions are represented by rectangles and the results of actions are represented by trapezoids.

Action 105A, directing light 216 from laser 217 at target 209, and action 105B, shooting tin droplets 205 at target 209, combine to form microplasma 210. Microplasma 210 produces EUV light 214A, which is the desired product, and contributes tin or similar contaminants to contaminant-containing gas 206B within chamber 241. Although contaminants are described as coming from microplasma 210, some or all of them contaminants may come from the process that forms microplasma 210.

Action 105C results in gas 206A entering chamber 241. Contamination from microplasma 210 combines with gas 206A to form contaminated gas 206B within chamber 241. Contaminated gas 206B within chamber 241 results in contaminated gas 206C exiting chamber 241. Contaminated gas 206B also results in contaminant deposition 108 within chamber 241 at locations other than on EUV collector 201.

Some of the gas 206B flows near EUV collector 201 and becomes circulating contaminant-containing gas 206D adjacent EUV collector 201. Gas 206D can be circulating at least in part as a result of action 107, rotating EUV collector 201. Contaminated gas 206D adjacent to EUV collector 201 results in contaminant deposition 114 on EUV collector 201. Because gas 206D circulates and because EUV collector 201 rotates, the amount of contaminant deposition 114 is diminished and such contaminant deposition 114 that does form on EUV collector 201 is relatively uniform across mirror surface 212.

The concentration of contaminants within the gas 206B eventually approaches a steady state, at which point the rate at which contaminants are produced is matched by the rate at which contaminants are removed from the atmosphere of chamber 241. The removal mechanisms include convection out of the chamber 241 with out-flowing gas 206C, contaminant deposition 114 on collector 201, and contaminant deposition 108 elsewhere in chamber 241. Increasing the proportion of contaminants removed by out-flowing gas 206C and contaminant deposition 108 elsewhere in chamber 241 decreases contaminant deposition 114 on collector 201.

The concentration of contaminants in gas 206B can be reduced and the proportion of contaminants carried away with gas outflow 206C can be increased by raising the flow rate of gas 206 through chamber 241 induced by action 105C. In some embodiments, the flow rate of gas 206 is in the range from 10 to 200 slm (standard liters per minute). In some embodiments, the flow of gas 206 is maintained at a substantial rate. A flow rate of at least about 20 slm is a substantial rate in the present context. In some embodiments, the flow rate of gas 206 through chamber 241 is at least about 50 slm.

In some embodiments, contaminant deposition 114 on collector 201 is reduced by stimulating circulation of gas 206D near collector 201 by continuous rotation 107 of collector 201 during operation of EUV lithography system 200. Increasing circulation of gas 206D moves contaminants away from collector 201, increasing the amount of contaminant that is removed with gas outflow 206D or by deposition 108 elsewhere in chamber 241 and decreasing the amount of contaminant deposition 114 on collector 201.

The lithography system 200 includes collector 201, tin droplet generator 203, an optical system, and $CO_2$ laser 217. The optical system includes illumination optics 219, reticle 223, and projection optics 225. Stepper 305 on which a wafer 303 can be mounted may also be considered part of the lithography system 200. Of these components, at least collector 201 is located with chamber 241. Components of lithography system 201 other than target 209 and collector 201 are optionally located outside the chamber 241.

The mirror surface 212 of collector 201 is generally dish-shaped. In some embodiments, the mirror surface 212 is an ellipsoid. In some embodiments, the mirror surface 212 has a solid angle in the range from about 1 to about 3 steradians. The mirror surface 212 can have a focal point 218 located between the collector 201 and the illumination system 219. The mirror surface 212 of collector 201 has an axis of symmetry 208. The axis of symmetry 208 is generally a line connecting a centroid 211 of the mirror surface 212 and the focal point 218 of the collector 201.

Figure 4:
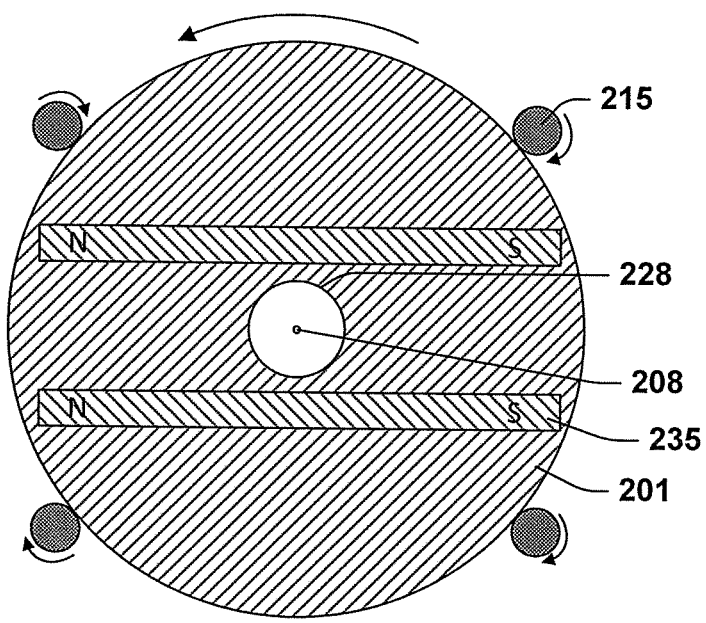
FIG. 4 is a back view of a collector for the photolithography system of FIG. 3 according to another embodiment of the present disclosure.

FIG. 4 provides a back view of the collector 201 according to another embodiment of the present disclosure. Collector 201 is rotatably mounted, which is a mounting that permits collector 201 to be rotated without dismounting. The rotatable mounting can be any type of mounting that permits rotation of collector 201. The mounting can be on a rotating shaft or on bearings. Rotatable mounting can include mounting on rollers 215. In most embodiments, the collector 201 is mounted to rotate about the axis of symmetry 208.

Figure 5:
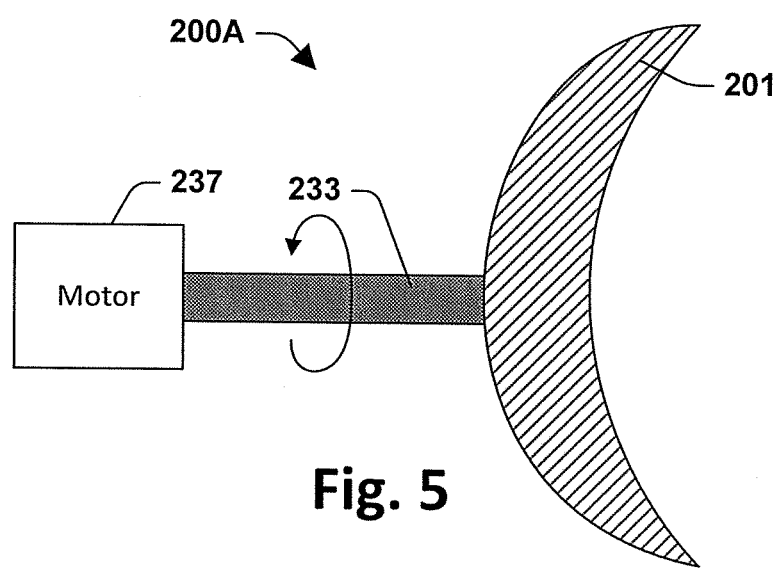
FIG. 5 illustrates the mounting of a collector according to another embodiment of the present disclosure.

In the embodiment illustrated by FIG. 4, the collector 201 is mounted about its perimeter, on rollers 215 in this example. Perimeter mounting has the advantage of high positional stability. FIG. 5 illustrates an alternate embodiment, an EUV lithography system 200A in which the collector 201 is centrally mounted, on a shaft 233 in the example. Mounting in a shaft 233 has the advantage of simplicity. The shaft 233 can be made hollow to allow the passage of light 216 from laser 217. Alternatively, laser 217 can be repositioned from the location shown in FIG. 3.

Rotation of the collector 201 can be manual, however, in most embodiments, the collector 201 is configured for automatic rotation. In some embodiments automatic rotation is driven by a motor 237. Motor 237 can be mechanically coupled to the collector 201. For example, motor 237 can be coupled to drive rotation of the collector 201 through one or more of the rollers 215 or shaft 233.

In some embodiments, the collector 201 is driven to rotate by an electromagnetic force while avoiding a mechanical connection to any motor 237. Decoupling the collector 201 from a motor 237 and rotating the collector 201 without direct mechanical coupling to a driving device reduces forces that can affect the focus of collector 201. Configuring collector 201 to be driven be an electromagnetic force can include affixing one or more permanent magnets 235 to collector 201 as illustrated by FIG. 4. Rotation of collector 201 can then be actuated by applying a rotating magnetic field. Permanents magnets 235 can be replaced by electromagnets. In some embodiments, a permanent magnet 235 is coextensive with surface 212 of collector 201. For example, a frame or substrate for the collector 201 can provide a magnet 235. In some embodiments, the system 200 is configured to permit rotation of the collector 201 without opening the chamber 241.

In some embodiments, the system 200 produces EUV light with a wavelength in the range from 3 nm to 15 nm, for example a wavelength of about 13.5 nm. A generator for droplets other than tin can be used in place of tin droplet generator 203 and another wavelength laser can replace $CO_2$ laser 217 to provide other wavelengths of EUV light. Microplasma 210 can be formed in any suitable manner.

Nearly all materials strongly absorb EUV radiation. Accordingly, in some embodiments, the optics 221 of the illumination system 219 and the optics 227 of the projection optics 225 are reflective optics. These optics can be configured for near normal angles of incidence. Reflective optics can be multilayer structures that operate as distributed Braggs reflectors. The thickness of the layers can be optimized for each optical system component 221 and 227 with respect to the wavelength of light 214 and angle of incidence.

The mirror surface 212 of the collector 201 can also be a multilayer reflector of any suitable structure and composition. The mirror surface 212 can include a distributed Bragg reflector formed from alternating layers of a high index of refraction material and a low index of refraction material. For example, the alternating layers can be Mo and Si or Mo and Be. In some embodiments, the mirror surface 212 contains more than 20 pairs of alternating layers. In some embodiments, the mirror surface 212 obtains a reflectivity greater than 60%. The uppermost layer can be protected from oxidation by a capping layer, such as a layer of Ru. An opening 228 through the center of mirror surface 212 can be provided to allow the passage of light 216 from laser 217.

The reticle 223 can include a distributed Bragg reflector. In addition, the reticle 223 generally includes phase shifting layers and/or absorber layers to define the pattern. In some embodiment, the reticle 223 is an absorberless phase-shifting mask.

The present disclosure provides a method of operating a lithography system. The method include generating EUV light, using a collector to gather and focus the light onto an optical system, rotating the collector to a new position, and again using the collector to gather and focus the light onto an optical system. The optical system illuminates a reticle and projects an image from the reticle onto a target.

Rotating the collector according to this method causes contaminants that deposit on the collector to be more evenly distributed over the collector's surface. More evenly distributing the contaminants can reduce the effect of contamination on image fidelity and can significantly increase the useful life of the collector. By rotating the collector at sufficient speed, some contaminating debris can be removed through the action of centrifugal force. If gas is present in the chamber housing the collector, rotating the collector during operation of the EUV lithography system can enhance gas convection near the collector and reduce the rate at which contaminants deposit on the collector.

The present disclosure also provides a method of cleaning an EUV light collector. The method includes rotatably mounting the EUV light collector and spinning the light collector while the light collector is heated to a temperature above the melting point of tin.

The present disclosure provides a lithography system including an EUV light source and an optical system. The optical system includes illuminator optics, a reticle stage, and projection optics. A rotatably mounted light collector is configured to reflect and focus light from the light source onto the illuminator optics.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. A method of operating an extreme ultraviolet (EUV) lithography system, comprising:
   generating EUV light;
   using a collector to gather and focus the light onto an optical system that illuminates a reticle and projects an image from the reticle onto a target;
   engaging a plurality of rollers around an outer perimeter of the collector and using the rollers to rotate the collector to a new position, wherein the rollers are configured to rotate the collector to a new position at a periodic time interval and wherein an amount of rotation for the periodic time interval is random; and
   again using the collector to gather and focus the light onto the optical system that illuminates a reticle and projects an image from the reticle onto a target.

2. The method of claim 1, wherein the collector is rotated while the collector is gathering and focusing the light.

3. The method of claim 2, wherein the collector is rotated continuously while the collector is gathering and focusing the light.

4. The method of claim 1, wherein the collector is rotated by applying a mechanical force to the collector.

5. The method of claim 1, wherein the collector is rotated while within an enclosed chamber of the EUV lithography system.

6. The method of claim 5, further comprising:
   while rotating the collector, controlling the pressure of gas in a chamber that houses the collector.

7. The method of claim 6, further comprising:
   while rotating the collector, flowing gas through the chamber that houses the collector.

8. The method of claim 1, wherein the collector is rotated while the EUV lithography system is online.

9. The method of claim 1, wherein the collector has a focal point that does not change position as the collector is rotated to a new position.

10. The method of claim 1, further comprising spinning the collector while at a temperature of at least 250° C. at sufficient speed to cause droplets of tin to roll off the collector's surface through the action of centrifugal force.

11. The method of claim 1, wherein rotating the collector reduces a rate at which the collector becomes contaminated.

12. The method of claim 1, wherein the collector is a continuous body between a central portion of the collector and an outermost circumferential edge of the collector, and wherein the rollers have an outer circumference in direct contact with an outermost circumference of the collector.

13. The method of claim 1, further comprising:
   prior to rotating the collector, determining whether the EUV lithography system is offline or online; and
   selectively rotating the collector based on whether the EUV lithography system is online or offline.

14. The method of claim 1, wherein the periodic interval is periodic with respect to a number or pulses from a laser, a number of exposures, or a number of wafers processed.

15. A method of cleaning an extreme ultraviolet (EUV) light collector, comprising:
   rotatably mounting the EUV light collector so an outer circumference of the EUV light collector engages a plurality of rollers, wherein each roller is adapted to spin about its own roller axis and the roller axes of the respective rollers are spaced about the outer circumference of the EUV light collector; and
   using the rollers to spin the light collector at a periodic time interval while the light collector is heated to a temperature above the melting point of tin, wherein an amount of rotation for each periodic time interval is random.

16. A lithography system, comprising:
   an extreme ultraviolet (EUV) light source;
   an optical system comprising illuminator optics, a reticle stage, and projection optics; and
   a rotatably mounted light collector configured to reflect and focus light from the light source onto the illuminator optics; and
   a plurality of rollers engaging an outer perimeter of the light collector, the plurality of rollers configured to facilitate axial rotation of the light collector about a central axis of the light collector, wherein the rollers are configured to rotate the collector to a new position at a periodic time interval and wherein an amount of rotation for the periodic time interval is random.

17. The system of claim 16, further comprising a motor configured to rotate the light collector.

18. The system of claim 16, further comprising:
   a chamber housing the rotatably mounted light collector;
   wherein the chamber has an inlet and an outlet configured to provide a continuous gas flow through the chamber during operation of the lithography system.

19. The system of claim 16, wherein the light collector is configured to rotate during operation of the lithography system.

20. The system of claim 19, wherein the light collector is configured to rotate continuously during operation of the lithography system.

* * * * *